United States Patent [19]

Behn et al.

[11] 4,277,516
[45] Jul. 7, 1981

[54] METHOD FOR GENERATING LAYERS ON A CARRIER FOIL

[75] Inventors: Reinhard Behn; Hermann Heywang, both of Munich; Horst Pachonik, Unterhaching, all of Fed. Rep. of Germany

[73] Assignee: Siemens Aktiengesellschaft, Berlin & Munich, Fed. Rep. of Germany

[21] Appl. No.: 107,828

[22] Filed: Dec. 28, 1979

[30] Foreign Application Priority Data

Jan. 10, 1979 [DE] Fed. Rep. of Germany ....... 2900772

[51] Int. Cl.³ .................. B05D 5/12; H01G 7/00
[52] U.S. Cl. ........................ 427/81; 427/41;
427/255.5; 427/255.6; 427/258; 427/296;
29/25.42; 118/718
[58] Field of Search ................. 427/39, 40, 41, 79,
427/81, 251, 255.5, 255.6, 255.7, 258; 29/25.42,
25.41; 118/50.1, 718, 720, 730, 733; 361/323

[56] References Cited

U.S. PATENT DOCUMENTS

| | | | |
|---|---|---|---|
| 2,925,062 | 2/1960 | Schwindt | 118/733 X |
| 3,069,283 | 12/1962 | Coleman | 427/41 |
| 3,183,563 | 5/1965 | Smith | 118/733 X |
| 3,600,122 | 7/1966 | Coleman | 427/41 X |
| 3,669,720 | 6/1972 | Remer | 427/41 X |
| 4,153,925 | 5/1979 | Gazard et al. | 427/41 X |

FOREIGN PATENT DOCUMENTS 1009883 6/1957 Fed. Rep. of Germany .

*Primary Examiner*—John D. Smith
*Assistant Examiner*—Bernard Plantz
*Attorney, Agent, or Firm*—Hill, Van Santen, Steadman, Chiara & Simpson

[57] ABSTRACT

Method and apparatus for generating layers on a carrier film wherein a plurality of glow polymerization layers and intervening metal layers are applied to a carrier foil 3 on a continuous process. The carrier foil is passed over a drum 4 and conducted through a first vacuum system wherein glow polymerization electrodes apply glow polymerization layers to the foil then the foil passes through a vacuum lock into a second vacuum chamber wherein a metallization device 10 is situated so as to apply a metallization layer. Then the foil passes through a second vacuum lock to the first vacuum chamber wherein a second polymerization layer is applied over the metallization layer. A diaphragm strip 19 also passes over the foil and is continuously used during the polymerization and metallization steps.

3 Claims, 4 Drawing Figures

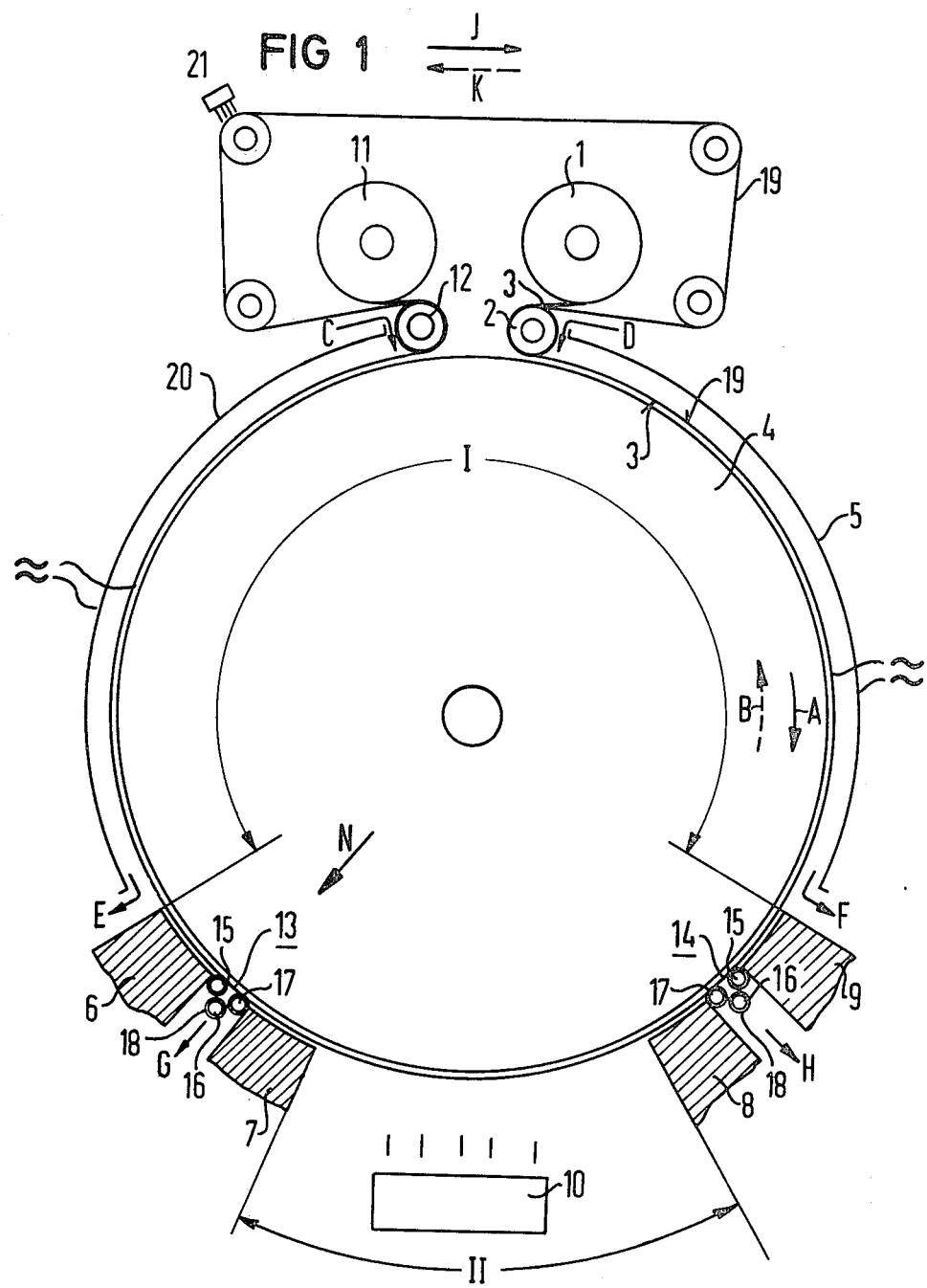

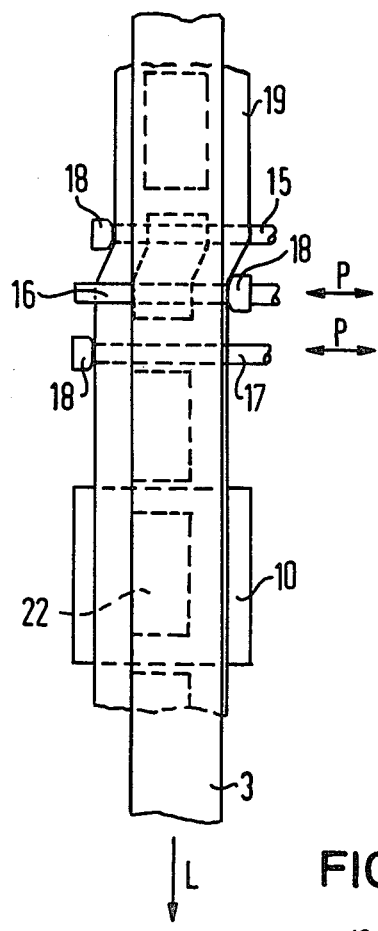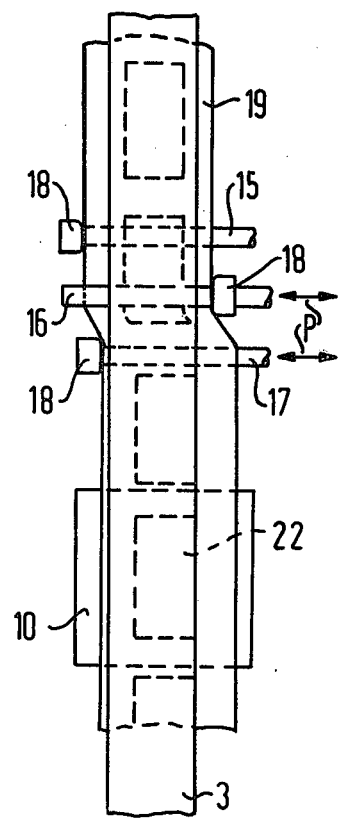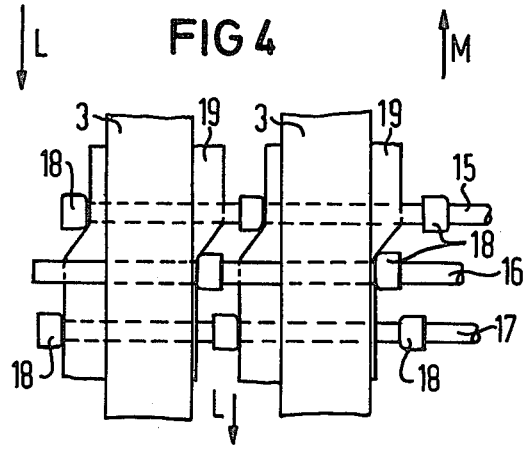

METHOD FOR GENERATING LAYERS ON A CARRIER FOIL

BACKGROUND OF THE INVENTION

1. Field of the Invention

The invention relates in general to methods for applying layers to a carrier foil particularly for the manufacture of electrical capacitors in which the carrier foil is passed through a first vacuum chamber after being unwound from a supply roll and is held against a cylinder jacket of a drum and passes through first and second vacuum chambers wherein it is coated in the first vacuum chamber with polymerization layers and in the second vacuum chamber with metallized layer after which it is passed through the first vacuum chamber and a polymerization layer is applied over the metallized layer before being rewound on a second supply roll. This invention relates in general to the formation of carrier foils for constructing capacitors.

2. Description of the Prior Art

Methods for applying polymerization layers and metallized layers to foil are described in German AS No. 1,009,883. In such system, a second vacuum chamber is used wherein the foil is applied to a metallization zone.

SUMMARY OF THE INVENTION

In the present invention metal layers and glow polymerization layers are alternately applied to a carrier foil without the individual layers coming into contact with oxygen during the process.

This object is achieved in that the carrier foil is applied to the cylinder jacket of a drum in a first vacuum chamber and the carrier foil lying against the drum is successively conducted through a glow polymerization region mounted in the first vacuum chamber and then through a vacuum lock and into a second vacuum chamber wherein metallization is accomplished with a metallization device and then through a second vacuum lock back into the first chamber where a second glow polymerization segment applies a second glow polymerization layer before the foil is released from the cylinder jacket of the drum and applied to a second supply roll.

In this manner, the polymerization layers and metal layers can be advantageously arranged alternately one above the other without them being damaged due to contact with atmospheric oxygen of other injurious gases.

For manufacturing electrical capacitors the direction of running the foil is reversed after the carrier foil is completely unwound from a first supply roll and wound onto a second supply roll and then after reversal has occurred and the foil has been completely unwound from the second supply roll onto the first supply roll the direction is again reversed and the process continued until the desired number of layers are formed on the foil. In the method of the invention, the dielectric is respectively formed by two layers of which each results from a single running direction of the foil. Only the layer applied directly to the carrier foil and the top most covering layer are single layers. The result is that a dielectric with high puncture strength is achieved and the number of layers to be applied can be selected to be very large since damage to the layers due to external influences is eliminated.

Very efficient fabrication of high volume capacitors and, thus, efficient use of the material is achieved in that the carrier foil can have multiple widths as required in a particular capacitor and with the use of only one laterally displaceable diaphragm system, the layers formed on the carrier are limited to a plurality of strips of the width required in the capacitor lying adjacent to each other and the diaphragm system depending on the running direction of the band is alternately displaced toward the left, or respectively, toward the right in the region of the second vacuum chamber wherein the position of the diaphragm system in the area of the glow polymerization segment is always held in the center. With this method, a very high reproducibility of the position of the layers lying atop one another can be accomplished since all layers are formed with the same diaphragm and since the same guidance devices for the diaphragm are always employed. Thus, for example, offsets of the antipolar coatings of 0.2 mm can be realized in production.

For the implementation of the described method, the diaphragm system can be constructed of a plurality of bands travelling with the carrier foil and for generating the lateral displacement groups of guidance rolls or rollers can be arranged between the metal coating segment in the second vacuum chamber and the glow polymerization segments in the first vacuum chamber and control devices are present which depending on the direction of rotation of the drum cause a displacement of the guidance rollers of each group that are mounted in the metallization segment. The present invention requires only a single diaphragm system which consists of bands which have elasticity that allows slight displacement. So as to prevent elastic deformation of the bands it is advantageous that for covering the parts of the foil that are not to be coated, at least one continuous band or, respectively, a system of continuous bands be present in each vacuum chamber, and that these bands are conducted so that they lie against the cylinder jacket of the drum in the area of the respective coating with metal or polymerization material and that the bands in the second chamber where the metallization occurs are capable of being moved to positions which are laterally displaced relative to one another. The position of the bands will always be the same for a single direction of rotation of the drum and the bands in the first chamber are always moved to a lateral position which lies between the two positions of the corresponding bands in the second chamber. The apparatus is designed such that it contains two bands or band systems in the first vacuum chamber with one respectively conducted in the area of glow polymerization segment lying against the cylinder jacket of the drum. Shoulders are suitable as the guidance means for the bands or for the band system.

So as to fully utilize the dimensions of the drum and to avoid coating of the portions of the drum serving as the vacuum seal, the apparatus advantageously contains two glow electrodes in the first chamber which partially surround the drum in the form of concentric ring segments and which extend between the respective vacuum locks and one respective deflection roller for the removal or respectively for the application of the foil and wherein these glow electrodes are narrower than the carrier foil.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWINGS

FIG. 1 is an end sectional view illustrating the invention;

FIG. 2 is a detail view illustrating the roller system of the invention;

FIG. 3 is another detail view illustrating the roller system of the invention; and FIG. 4 illustrates several screen systems mounted adjacent each other which can be displaced by means of rollers and limit stop means.

DESCRIPTION OF THE PREFERRED EMBODIMENTS

FIG. 1 is a sectional view through the machine illustrating the apparatus and method of the invention and illustrates a drum 4 mounted on a suitable shaft for rotation about its axis and a carrier foil 3 extends from a first roll 1 over a guide roller 2 and then about the periphery of the drum 4 to guide roll 12 and then to a take up roll 11. A first vacuum chamber I is formed for substantial distance about the periphery of the drum 4 and a second vacuum chamber II is formed about a smaller portion of the drum periphery between the ends of the vacuum chamber I. A diaphragm or screening belt 19 passes over guide roll 2 and engages the foil 3 and passes around the drum 4 to guide roll 12 and then over a number of guide rolls and by a cleaning brush 21 to another pair of guide rolls and back to guide roll 2 as shown. All of the foil 1 is passed by the drum 4 to the reel 11 and then when the foil has been removed from drum 1 the drums are reversed and the drum 11 supplies foil back to the roll 1 and each time the foil passes back and forth between the rolls 1 and 11, layers of polymerization and metal are applied as the foil passes the drum 4.

The purpose of the diaphragm or screen layer 19 is to limit the areas where the polymerization and metallization layers are formed on the foil 3. A first polymerization electrode 5 covers a portion of the drum 4 and as the foil 3 passes by the electrode 5 a glow polymerization layer is applied to the carrier foil. For this purpose, the monomer is blown in the direction of the arrow D and is polymerized by the electrode 5. The remaining and used monomer is suctioned off at the position indicated by the arrow F after it has passed through the electrode 5. The glow electrode 5 encloses the drum and is in the form of a cylindrical ring segment. It is narrower than the carrier foil so that the margin areas of the cylinder jacket 4 are not coated with a polymerization layer.

After the foil 3 has passed the electrode 5, it passes through a vacuum lock seal which is formed by jaw members 8 and 9. The jaw members 8 and 9 are provided with only a narrow gap between their ends and the cylinder jacket surface of drum 4. Any gas which diffuses through this gap is sucked away between the jaws 8 and 9 in the direction of arrow H by applying a suitable vacuum pressure between the jaws.

Also mounted between the jaws 8 and 9 is a roller system 14 comprising three rollers 15, 16 and 17 and these rollers are capable of laterally deflecting the diaphragm or screen system 19 in that the rollers 16 and/or 17 are displaced perpendicular to the plane of the drawing of FIG. 1 so that the foil will be deflected by means of dogs 18. If the diaphragm or screen system 19 consists of a plurality of strip-like diaphragms mounted adjacent to each other then the deflection rollers 15, 16 and 17 will preferably have at least one dog 18 for each of the diaphragm strips.

In the vacuum chamber II, a metallization device 10 will apply metallized layer to the foil 3 after which the foil 3 will pass by the jaws 7 and 6 and by a roller system 13 comprising rollers 15, 16 and 17' which allow a parallel displacement of the diaphragms screen system 19. Residual gas is sucked off in the direction of arrow G between the jaws 6 and 7 of the second vacuum lock.

The carrier foil 3 passes through a second glow polymerization segment which includes a glow polymerization electrode 20 which is constructed similar to the glow polymerization electrode 5. A monomer gas is blown in at point C in the direction of arrows C and passes by the electrode 20 and exits at the arrow E where suction is applied. After receiving the second polymerization layer the foil passes over the roller 12 and is wound onto the roll 11 and the diaphragm or screening system 19 is separated and passes by the brush 12 and back to the roller 2 as shown.

By rotating the drum 4 in the direction of arrow A, the carrier band foil mounted on supply roll 1 will be provided with a glow polymerization layer in the region electrode 5, then a metal layer in the region of the metallizing device 10 and then a second glow polymerization layer in the region of the electrode 20. After the carrier foil has been completely unwound from the supply roll 1, the rotational direction of the drum 4 will be reversed so that it rotates in the direction of the dash line arrow B and then a glow polymerization layer will be applied in the region of the electrode 20, then a metal layer in the region of the metallizing device 10 and a second glow polymerization layer will be applied in the region of the electrode 5. By repeatedly reversing the rotational direction of the drum 4 as many layers of polarization material and metal material can be applied to the foil 3 as desired.

With the use of a hollow design of the glow electrodes and apertures which are directed toward the cylindrical surface of the drum 4, the monomer can be blown so as to be uniformly distributed over the glow discharge space which will result in uniform layer thicknesses of the polymerization layer.

The brushes 21 clean the diaphragm screen system 19 of any coating substances which have been deposited thereon so it can be reused.

FIGS. 2 through 4 illustrate the roller system 13 as seen from the direction indicated by the arrow N. As is illustrated in FIGS. 2 and 3, the screening diaphragm system can be displaced by means of the roller system 13 relative to the carrier foil 3 which is to be coated. The movement of the screening diaphragm system 19 is accomplished by the limit stops 18 and the rollers 15, 16 and 17. The displacement occurs as indicated in the direction of motion L or respectively. M in FIG. 2 toward the right and in FIG. 3 toward the left. The screen diaphragm openings 22 define the limit of the vapor deposit regions from the evaporator 10. The roller 16 or, respectively 17 can be displaced in the direction of the arrow P toward the right or, respectively, toward the left so that the positions of the rollers are adjustable as indicated in FIGS. 2 and 3.

FIG. 4 illustrates several screen diaphragm systems 19 which run next to each other and such systems can be displaced by means of the rollers 15, 16 and 17 with several limit stops 18.

Thus, consideration of FIGS. 2, 3 and 4 illustrate how the screen 19 can be moved laterally relative to the foil 3. As shown in FIG. 2 the foil 3 moves substantially down relative to FIG. 2 pass the rollers 15, 16 and 17. However, the rollers 16 and 17 are moved laterally to the left relative to FIG. 2 and the enlarged stop portion of rollers 15, 16 and 17 designated 18 cause the screen material 19 to be laterally moved to the left between the rollers 15 and 16. Since the screening material 19 is wider than the foil 3, the foil 3 is not deflected laterally. FIG. 3 illustrates a lateral displacement of the foil to the left between rollers 17 and 16 by the stop members 18 as the foil 3 and screening material 19 is moving upwardly relatively to the Figure as illustrated by the arrow M.

FIG. 4 illustrates two systems operating adjacent each other wherein for example the roller 15 has three stop members 18 formed thereon and when the foils 3 and screening material 19 are moving downwardly relative to FIG. 4 as indicated by the arrow L the foil 3 will move without being deflected but the stop members 18 and rollers 15 and 16 will laterally deflect the screen material 19 to the left relative to FIG. 4 as the materials move in the direction of the arrow L.

Although the invention has been described with respect to preferred embodiments, it is not to be so limited as changes and modifications can be made which are within the full intended scope of the invention as defined by the appended claims.

We claim as our invention:

1. A method for generating layers on a carrier foil, particularly for the manufacture of electrical capacitors, in which the carrier foil is unwound from a supply roll and passed through a first vacuum chamber while lying against the cylinder jacket of a drum and then passes through a vacuum lock into a second vacuum chamber where it is coated with metal and is returned while still lying against the cylinder jacket of the drum through a second vacuum lock into the first vacuum chamber after which it is wound onto a second supply roll, and in which a metal layer is applied to the foil in the second vacuum chamber, characterized in that the carrier foil (3) engages the cylinder jacket of the drum (4) in the first vacuum chamber (I); and the carrier foil (3) while lying against the drum (4), is successively conducted through a glow polymerization segment (5) mounted in the first vacuum chamber (I), then through a first vacuum lock (8, 9) then through the second vacuum chamber (II) wherein the metallization device (10) is mounted and then through a second vacuum lock (6, 7) back into the first vacuum chamber (I), and through a second glow polymerization segment (20) in the first vacuum chamber; and wherein carrier foil (3) is only removed from the cylinder jacket of the drum (4) just before it is supplied to a second supply roll (11).

2. The method according to claim 1, characterized in that for the manufacture of electrical capacitors, after the carrier foil (3) has been completely unwound from the first supply roll (1), the running direction of the foil is reversed; and after being completely unwound from the second supply roll (11), the running direction is again reversed; and in that this operation is repeated until the desired number of layers is arranged above one another.

3. A method according to claim 2, characterized in that the carrier foil (3) has a width which is a multiple of that required in the capacitor; and by means of only one laterally displaceable diaphragm system (19), the layers deposited on the carrier foil (3) are limited to a plurality of strips having the width required in the capacitor, said strips lying next to one another; and the diaphragm system (19), depending upon the running direction of the carrier foil (3), is alternately displaced toward the left or, respectively, toward the right in the area of the second vacuum chamber (II), whereas the position of the diaphragm system (19) in the area of the glow polymerization segments is always maintained in the center.

* * * * *